United States Patent
Scher et al.

(10) Patent No.: US 7,066,376 B2
(45) Date of Patent: Jun. 27, 2006

(54) METHODS FOR MANUFACTURING A TACTILE SENSOR USING AN ELECTRICALLY CONDUCTIVE ELASTOMER

(75) Inventors: Irving S. Scher, Berkeley, CA (US); Daniel Conrad Benson, Berkeley, CA (US)

(73) Assignee: Siemens Technology-To-Business Center LLLC., Berkeley, CA (US)

( * ) Notice: Subject to any disclaimer, the term of this patent is extended or adjusted under 35 U.S.C. 154(b) by 388 days.

(21) Appl. No.: 10/714,262

(22) Filed: Nov. 14, 2003

(65) Prior Publication Data

US 2004/0104260 A1 Jun. 3, 2004

Related U.S. Application Data

(62) Division of application No. 09/965,160, filed on Sep. 26, 2001, now Pat. No. 6,871,395.

(60) Provisional application No. 60/310,612, filed on Aug. 6, 2001.

(51) Int. Cl.
*B23K 31/02* (2006.01)

(52) U.S. Cl. ............ 228/175; 228/123.1; 29/840; 29/832; 29/839; 156/272.2

(58) Field of Classification Search ............ 228/175, 228/123.1, 121
See application file for complete search history.

(56) References Cited

U.S. PATENT DOCUMENTS

| 3,959,585 | A |   | 5/1976  | Mattes et al. |
|-----------|---|---|---------|---------------|
| 4,322,983 | A |   | 4/1982  | Sado |
| 4,455,450 | A |   | 6/1984  | Margolin |
| 4,484,026 | A |   | 11/1984 | Thornburg |
| 4,517,546 | A |   | 5/1985  | Kakuhashi et al. |
| 4,680,430 | A |   | 7/1987  | Yoshikawa et al. |
| 5,060,527 | A |   | 10/1991 | Burgess |
| 5,232,532 | A |   | 8/1993  | Hori |
| 5,250,439 | A | * | 10/1993 | Musho et al. ............ 205/778 |
| 5,274,362 | A |   | 12/1993 | Potvin |

(Continued)

FOREIGN PATENT DOCUMENTS

EP          033857 A2    10/1989

(Continued)

OTHER PUBLICATIONS

Material Safety Data Sheet, Zotefoams plc, MSDS-15 EV CN Grades, no date available.

*Primary Examiner*—Jonathan Johnson

(57) ABSTRACT

The present invention provides methods for connecting electrically conductive elastomer to electronics that reduce cost and time for manufacturing a tactile sensor that includes an electrically conductive elastomer such as a conductive foam. The methods provide a good connection between the electrically conductive elastomer and the electrodes connected to the electronics, which provide for repeatable measurements. The methods can be used for all cases of electrically conductive elastomers and elastomers made to be conductive with the addition of conductive particles (such as carbon, silver, nickel, gold, etc.) including thermoplastic and some thermosetting elastomers.

10 Claims, 4 Drawing Sheets

U.S. PATENT DOCUMENTS

| | | |
|---|---|---|
| 5,311,779 A | 5/1994 | Teruo |
| 5,365,461 A | 11/1994 | Stein et al. |
| 5,714,252 A | 2/1998 | Hogerton et al. |
| 5,838,309 A | 11/1998 | Robsky et al. |
| 5,845,251 A | 12/1998 | Case |
| 5,977,867 A | 11/1999 | Blouin |
| 5,995,083 A | 11/1999 | Sato et al. |
| 6,072,130 A | 6/2000 | Burgess |
| 6,089,106 A * | 7/2000 | Patel et al. ............ 73/862.582 |
| 6,114,645 A | 9/2000 | Burgess |
| 6,158,115 A | 12/2000 | Tsukagoshi et al. |
| 6,219,911 B1 | 4/2001 | Estes et al. |
| 6,433,694 B1 * | 8/2002 | Dolan et al. ................ 340/603 |
| 6,871,395 B1 * | 3/2005 | Scher et al. .................. 29/840 |

FOREIGN PATENT DOCUMENTS

| | | |
|---|---|---|
| EP | 0225008 B1 | 12/1990 |
| GB | 2350431 A | 11/2000 |
| JP | S55-32542 | 3/1980 |

* cited by examiner

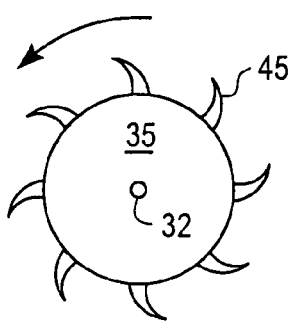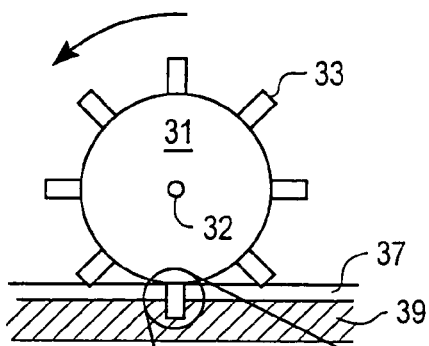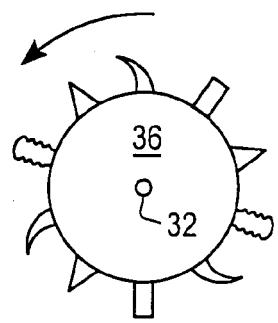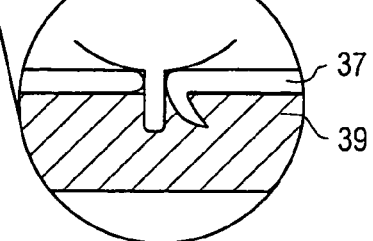
FIG. 3(b)    FIG. 3(a)    FIG. 3(c)
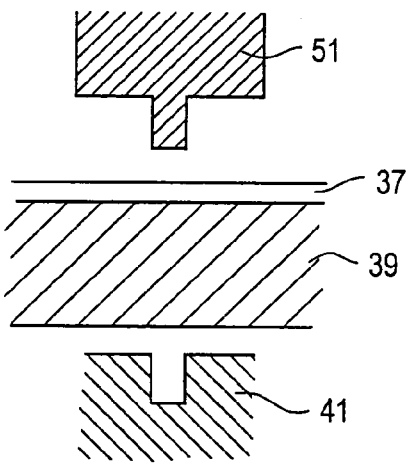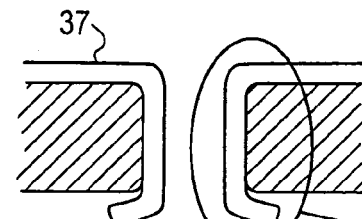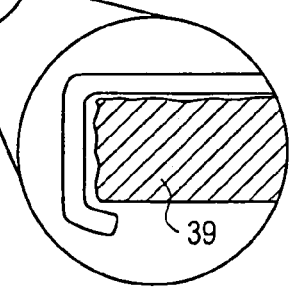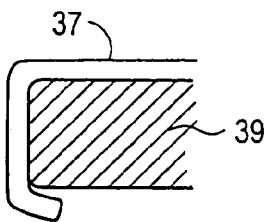
FIG. 4(a)    FIG. 4(b)    FIG. 4(c)

METHODS FOR MANUFACTURING A TACTILE SENSOR USING AN ELECTRICALLY CONDUCTIVE ELASTOMER

This application is a divisional of commonly owned U.S. application Ser. No. 09/965,160 filed Sept. 26, 2001, now U.S. Pat. No. 6,871,395 which claims priority from commonly own U.S. Provisional Application No. 60/310,612 filed Aug. 6, 2001.

BACKGROUND OF THE INVENTION

The present invention relates to the manufacture of tactile sensors that use electrically conductive elastomer and, in particular, to the attachment of electrodes to the elastomer.

A useful type of tactile sensor is one that senses not only the presence or absence of force, but the position and amount of applied force. Tactile sensors that use an electrically conductive elastomer (referred to as "elastomer") can convert the position or magnitude of applied force to a voltage (or current) using resistance changes. With tactile sensors having an electrically conductive elastomer, the internal resistance of the elastomer or the contact resistance between the elastomer and sensing electronics varies with the amount of applied force. Measurement of the position and of the amount of applied force can be made through proper application and measurement of voltage levels on the elastomer, which requires sufficiently rigid or firm attachment of electrodes to the elastomer in order to produce repeatable measurements. The elastomer must be linked to electronics that provide excitation (from a power source) and to devices that measure or use directly at least one electrical property. The electrodes that provide the electrical pathway are made typically from metal strips, wire, or sheets of conductor.

Besides reducing the overall number of parts and minimizing the steps required for production, the most important non-trivial problem encountered when designing and producing such a tactile sensor is the electrode connection between the electrically conductive elastomer and the electronics.

For a large group of sensors, the electrodes do not necessarily need to flex significantly and can be relatively small. For example, wire electrodes may run along an edge of a flexible elastomer sheet (such as in U.S. patent application Ser. No. 09/654,481 filed Jan. 9, 2000 and entitled "Tactile Sensor" which is incorporated by reference herein) or the electrodes may be fixed printed paths on a rigid printed circuit board (such as in U.S. Pat. No. 5,886,615). The quality of a conductive elastomer tactile sensor is judged on its ability to measure accurately, precisely, and consistently the resistance changes via the electrodes.

The contact impedance between the electrodes and elastomer needs to be known when the sensor is not under load (or when the elastomer first touches the electrode). Fluctuations of this contact resistance will influence the sensor measurements; precision and accuracy of position and/or pressure measurements are directly related to changes in non-loaded contact resistance. This is especially true for electrically conductive elastomers that have changing internal resistance with applied pressure; these are called piezoresistive materials. When using a piezoresistive elastomer in a tactile sensor (example described in U.S. Pat. No. 4,322,983 and U.S. Pat. No. 5,510,812), the contact resistance between the electrodes and elastomer needs to be known and minimized. Fluctuations of this contact resistance will influence significantly the sensor precision and accuracy; Burgess in U.S. Pat. No. 5,060,527 shows an example of this fact.

Tactile sensors have been disclosed (e.g., GB 2222258A, DE 19750671A, and Ser. No. 09/654,481) that use electrically conductive foams (referred to as "foams") that do not have significant internal resistance changes under load. These sensors measure the contact resistance between the electrodes and foam or the contact resistance between multiple layers of foam. In each of these cases, the reliability of the voltage application and the resistance measurements would be dramatically improved by firmly attaching at least one set of electrodes to the foam. In the case of Ser. No. 09/654,481, both sets of electrodes should be rigidly or firmly attached to the foam to produce repeatable measurements.

In the prior art, electrically conductive elastomers were connected to electronics or batteries using metal strips, wire, or sheets of conductor (different embodiments of electrodes). In most prior art the electrodes were not held rigidly to the elastomer; some sensors (e.g., U.S. Pat. No. 5,886,615 and U.S. Pat. No. 6,114,645) required the elastomer to deform before touching any electrode, which reduces significantly the sensitivity and precision of the sensor. In the other cases, the metal strips, wire, or sheets of conductor were held to the electrically conductive foam using pressure applied by external components or using particular electrically conductive adhesives (flexible adhesives with carbon, silver, or nickel mixed into it).

The prior art mentioned above suggests using pressure applied by external components to hold an electrode to electrically conductive elastomer (examples described in U.S. Pat. No. 4,322,983, DE 19750671A, and Ser. No. 09/654,481). Unfortunately, this method of linking electrode to elastomer does not have a precise (that is, a repeatable) contact resistance; given the similar loading and forcing histories, the contact resistance will vary when the sensor is not loaded. This problem is especially prevalent when the elastomer may be subject to being pulled as well as pushed.

Prior art has also suggested using conductive adhesives, such as conductive tape (3M 9713 XYZ-axis Electrically Conductive Tape) or conductive epoxies (DOW Silastic 732™ made conductive with Shawinigan Black™). These approaches have problems when used for manufacturing a sensor that uses an electrically conductive elastomer. Conductive tapes are typically designed for shielding applications that require connecting thin metal foils to grounded members. Though these tapes hold well to flat, smooth metal surfaces, they do not provide a constant contact resistance between the electrically conductive elastomer and metal electrodes. This is especially true during bending or flexing of elastomer at or near the electrode attachment; the contact resistance varies with deformation and, therefore, with forcing. Furthermore, when the elastomer takes the form of an open or closed cell foam, the tapes may not provide a good conductive path because the tape will only contact the top most foam lattice members. For this reason, conductive tapes cannot be used reliably in tactile foam sensors that measure accurately both position and pressure.

In some cases, conductive epoxies (or adhesives made to be conductive) will adhere well to and provide a reliable connection between electrodes and electrically conductive elastomer. Burgess, in U.S. Pat. No. 5,060,527, recommends using either polyvinyl chloride (PVC) or Dow Silastic 732™ made conductive with carbon, silver, or nickel. These adhesives, however, should not be used to adhere to most metals that would be used as electrodes (copper, zinc, and brass) or anything sensitive to acetic acid (Dow product information guide). Additionally, the suggested adhesives may bond well to the polyurethane or silicon elastomers recommended by Burgess, but do not bond well with most electrically conductive elastomers.

In general, the electrically conductive elastomer, e.g., electrically conductive polyethylene (Evazote™ foams made by Zotefoams) or polypropylene, may be chemically inert and difficult to bond, but such electrically conductive elastomers are preferred for some applications because they are inexpensive, biologically inert, uniform (density and resistance), and do not outgas. Special epoxies and treatments can be used to bond to electrically conductive elastomers, but such epoxies and treatments are expensive, require multiple steps, and/or contain chemicals that are harmful to the environment. Furthermore, the curing process associated with epoxies and the out-gassing that occurs with epoxies or treatments delay manufacturing and may require special chemical mixing, monitoring equipment or special environmental conditions to perform.

As seen from the above, improved methods for providing good electrode connections to electrically conductive elastomers in tactile sensors are desired.

SUMMARY OF THE INVENTION

The present invention provides novel methods for connecting electrically conductive elastomer to electronics that reduce cost and time for manufacturing a tactile elastomer sensor. The methods provide a good connection between the electrically conductive elastomer and the electrodes connected to the electronics, which provide for repeatable measurements. The methods can be used for all cases of electrically conductive elastomers and elastomers made to be conductive with the addition of conductive particles (such as carbon, silver, nickel, gold, etc.) including thermoplastic and some thermosetting elastomers.

According to one specific embodiment, the present invention provides a method of manufacturing a tactile sensor including an electrically conductive elastomer. The method includes the steps of providing a base having at least one electrode thereon, applying a low temperature solder to a top of the electrode, placing an electrically conductive elastomer on the base, and heating the electrically conductive elastomer on the base to a temperature below a melting point of the electrically conductive elastomer to cause the low temperature solder to wick into the electrically conductive elastomer.

According to another specific embodiment, the present invention provides another method of manufacturing a tactile sensor including an electrically conductive elastomer. The method includes the step of providing a base having a plurality of electrodes thereon, each of said plurality of electrodes having at least one spike extending out from the base at a defined angle θ. At least one spike of one of said plurality of electrodes protrudes from the base in an outward direction away from a direction of at least one spike of the other of the plurality of electrodes. The method also includes the steps of stretching the electrically conductive elastomer outward a certain distance, and placing the electrically conductive elastomer onto the base such that the electrically conductive elastomer becomes gripped by the spikes of the plurality of electrodes when the electrically conductive elastomer is no longer stretched. The method also includes the step of locally heating the electrically conductive elastomer to slightly higher than a melting point of electrically conductive elastomer to melt locally the electrically conductive elastomer around the spikes of the plurality of electrodes.

According to another embodiment, the present invention provides yet another method of manufacturing a tactile sensor including an electrically conductive elastomer. The method includes the steps of providing an electrically conductive elastomer, providing a layer comprising a conductive material to be at least one electrode on a top of the electrically conductive elastomer; perforating through the layer to create a plurality of burrs protruding from the layer of the conductive material into the electrically conductive elastomer, and melting the electrically conductive elastomer locally around the plurality of burrs to connect the at least one electrode to the electrically conductive elastomer.

Embodiments of the present invention are described in further detail in the following detailed description in conjunction with the drawings.

BRIEF DESCRIPTION OF THE DRAWINGS

FIGS. 3(a)–3(c) illustrate exemplary electrode stamping wheels that may be used in the heated stamping electrode attachment method, according to another specific embodiment; and FIGS. 4(a)–4(c) illustrate the heated stamping electrode attachment method according to the specific embodiment.

DETAILED DESCRIPTION OF SPECIFIC EMBODIMENTS

Figure 1A:
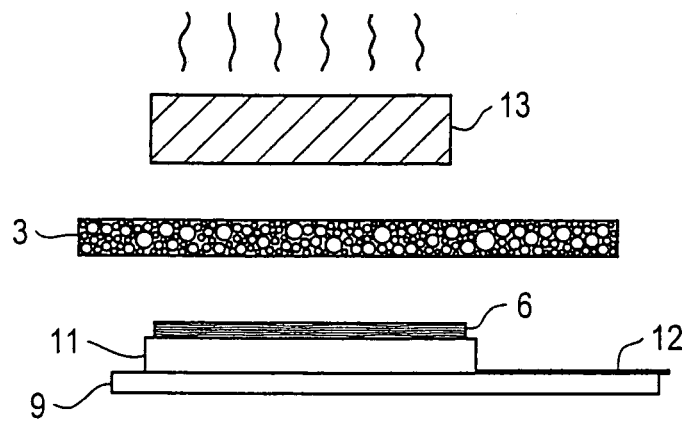
FIG. 1(a) illustrates the low temperature solder configuration, according to a specific embodiment.

The present invention provides novel methods for connecting electrically conductive elastomer to electronics that reduce cost and time for manufacturing a tactile elastomer sensor. The methods provide a good connection between the electrically conductive elastomer and the electrodes connected to the electronics, which provide for repeatable measurements. The methods can be used for all cases of electrically conductive elastomers and elastomers made to be conductive with the addition of conductive particles (such as carbon, silver, nickel, gold, etc.) including thermoplastic and some thermosetting elastomers.

Various methods for firmly connecting electrically conductive elastomer to electronics for use in tactile sensors that measure position and pressure are provided herein. The electrically conductive elastomer is linked mechanically to at least one electrode comprised of metal, electrically conductive polymer, or a polymer and alloy. According to various embodiments, the electrodes can be attached to the electrically conductive elastomer individually or in clusters—the attachment of a single electrode is a local process and in most cases will not influence the attachment of other electrodes. The mechanical connection is produced by the geometry and surface topology of the electrodes as well as by a heating process; these are designed to plastically deform the elastomer around rough portions of the electrodes. The electrodes are coupled electrically to the electronics of the sensor via wire or electrodes are conductive lines deposited on the surface of a printed circuit board (PCB).

For the purposes of this specification, elastomers are defined as those materials that can be deformed elastically by 10% or more from initial size, according to preferred embodiments. Elastomers, typically composed of bended polymers, can be thermoplastics or thermosetting polymers. Elastic thermosetting polymers have infrequent cross-links (cross-links occuring once in hundreds of carbons) in comparison to rigid thermosetting polymers. Examples of elastomers include, but are not limited to, polyvinyl chloride, polystyrene, polycarbonate, nylon, polyurethane, polyethylene, polypropylene, natural rubber, and Cis-polyisoprene. In particular, glass transitions for primarily crystalline thermoplastics can be from −90 to −110° C. for polyethylene (PE), −85° C. for polypropylene (PP), and 50° C. for nylon6. It is noted that if the operating temperature is below glass transition temperature, the polymer will be stronger but more brittle.

An electrically conductive elastomer is defined as an elastomer that is or can be made to be electrically conductive (500Ω or less per cm). Elastomers that change their electrical resistance with applied force (called "piezoresistive" materials) to about 500Ω or less per cm will also be considered electrically conductive elastomers. Electrically conductive elastomers can be intrinsically conductive by adding conductive particles (such as carbon, silver, nickel, gold, etc.) to an elastomer during its formation. Alternatively, coating cellular structured non-conductive elastomers with a conductive liquid or powder can produce electrically conductive elastomers—these materials are typically electrically conductive open-cell foams.

In some embodiments of the invention, a low temperature solder is used for connecting the electrodes to the electrically conductive elastomer. In this specification, low-temperature solders are defined as eutectic solders that melt at temperatures between about 70° C. and about 150° C., preferably 90° C. and 130° C.; these melting points are low compared to "normal" Sn/Pb solders that melt at temperatures near to 250° C. In most operations, the working temperatures for solders are 5 to 20° C. higher than their melting points. Low-temperature solders include typically mixtures of two or more of the elements Cr, Ag, Cd, In, Sn, Au, Pb, and Bi or the like, with the low-temperature aspect depending partially on relative ratio of elements used. Currently they are internationally available.

Using low temperature solder to connect elastomer to electronics is recommended for sensors that use thin sheets of open or closed cell, electrically conductive foams that are applied to solid mounting surfaces (for examples see Ser. No. 09/654,481 or DE 19750671A). This method does not work as well for high-density elastomers. The surface can be flat or have significant curvature. Though the raw materials required for this method are not the least expensive of the electrode attachment techniques described in this patent, the overall manufacturing time and specialty equipment are minimized.

The bottom surface of a metal electrode is attached to or part of a solid base; one example would be a metal trace on a printed circuit board. The electrode can be any shape or size required by the sensor and can have a non-oxidizing surface layer. There can be any number of electrodes attached to the base. The top surface of the electrode is coated with a layer of low temperature solder either before or after they are attached to the base. In areas around the electrode, an insulating (non-electrically conductive), heat resistant adhesive may be applied to the top surface of the base. Electrically conductive foam is placed on the base and electrode—the foam is held in place with the insulating adhesive or by light pressure on the top surface of the electrically conductive foam. The electrically conductive foam is heated to its top surface. The heating function (temperature, location, and time are the variables) should be chosen such that the foam remains cooler than its melting point, but conduction through the foam and/or convection of the ambient air heats the low temperature solder above its melting point. Heat may be applied in a controlled oven bake, heating elements, or the like. Heat may also be applied through the electrode itself to the solder (either but heat conduction or generation through resistive heating). When the solder becomes liquid, it is wicked naturally into the foam or assisted with mild negative pressure (a small vacuum).

EXAMPLE 1

Figure 1B:
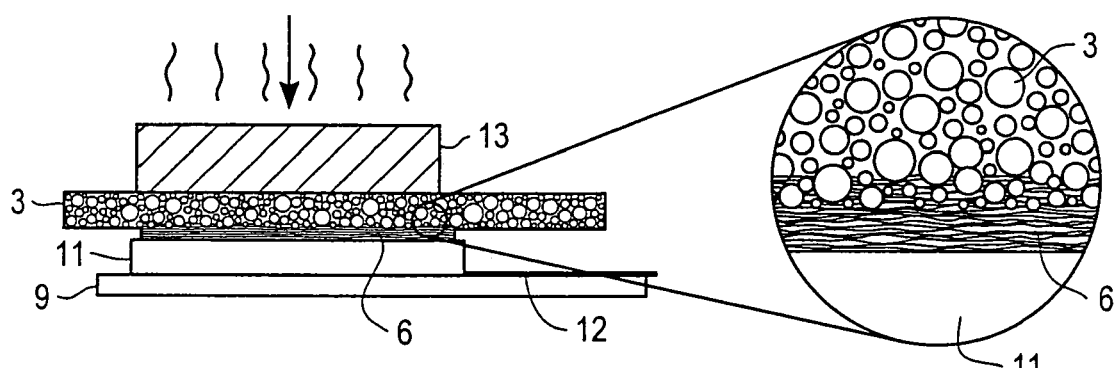
FIG. 1(b) illustrates the low temperature solder wicking into the electrically conductive foam during heating, according to the specific embodiment.
Figure 1C:
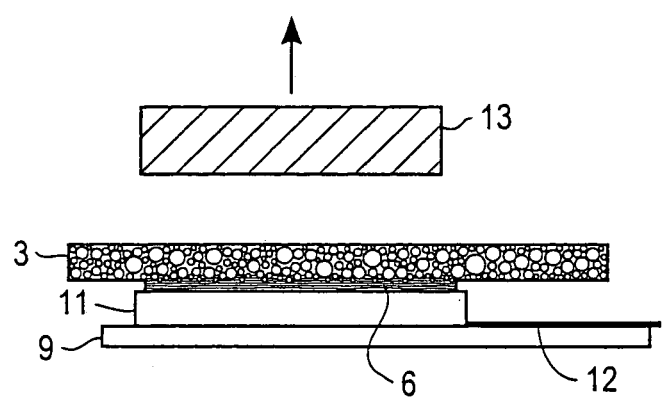
FIG. 1(c) illustrates the low temperature solder solidified into the foam, according to the specific embodiment.

FIGS. 1(a)–1(c) show one preferred embodiment used to produce the lower half of the tactile sensor (such as described in Ser. No. 09/654,481). For this example embodiment, FIG. 1(a) shows the first step of providing an electrically conductive conductive elastomer sheet 3, a base 9 having electrodes 11 thereon (only one electrode is shown for simplicity) that connect to wires 12 that will be connected to measuring electrodes of the tactile sensor, and a heating element 13 that will be used in later steps of the method. In this example, the electrically conductive foam sheet 3 is Evazote from Zotefoams, and the melting point of this conductive polyethylene is approximately 100° C. Of course, with other types of foams, the melting temperature likely will differ. Two examples of low-temperature solders 6 that could be used with this foam are 50Bi/27Pb/13Sn/10Cd (70° C. melting point) available from Nippon Joint Co., Ltd. and 44In/42Sn/14Cd (93° C. melting point) available from Melcor Inc.

As an example, base 9 can be a printed circuit board (PCB). Two electrodes 11 (only one electrode is shown for simplicity in FIGS. 1(a)–1(c)) are etched into the top surface of base 9. Electrodes 11 are connected to, for example, wires 12 that lead to measuring electronics. Low temperature solder 6 (described above) is heated and applied to the top surface of the electrodes 11. In some embodiments, small amounts of insulating adhesive (not shown) can be applied to the non-electrode portions of the base 9 or alternatively to the foam 3 where electrode contact will not be made. As seen in FIG. 1(b), the electrically conductive foam is placed onto solder 6 on top of the electrodes 11 on the base 9 (in some embodiments, the foam contacts not only the electrodes 11 but also the insulating adhesive) and heating element(s) 13 is heated to 100° C. and pressed gently on the top surface of the foam directly above the electrodes 11. Heat conduction through the foam 3 and/or convection through air cause the low temperature solder 6 to melt and wick into the electrically conductive foam 3. FIG. 1(b) also shows an enlarged view of the solder wicked into the foam 3. Once the heating element 13 is removed, as shown in FIG. 1(c), the solder 6 cools and provides a rigid electrical connection between the foam 3 and the electrodes 11.

In other specific embodiments of the invention, the method provides for stretching mounting and heat sealing of the electrically conductive elastomer onto the electrodes. Some sensors require electrodes to be used in pairs or sets attached on the same face. Other sensors require multiple electrodes at various intervals across the sensor length and width. For sensors with these configurations, special electrodes can be fashioned that hold the elastomer mechanically while heating locally joins electrically the elastomer to the electrodes. The electrodes connect to the sensor electronics via wires or traces on a printed circuit board. The material costs for this method are very low and this method can be used with most electrically conductive elastomers.

In such embodiments, electrodes are fashioned from or attached (permanently or temporarily) to a rigid surface and fashioned to hold the elastomer mechanically. Electrodes contain an electrically conductive base and electrically conductive gripping elements; the gripping elements are spikes or barbs connected both mechanically and electrically to the base. Two examples of the gripping elements include (but are not limited to) tooth-like spikes stamped from (but still attached to) the base and conductive tacks punched through the base.

The elastomer is stretched elastically and inserted downwards onto the gripping elements of the electrodes. The gripping elements impale the elastomer and hold it in place mechanically with help from the elastic forces produced by the elastomer. The pattern of the electrodes is designed in such a way that the elastomer is stressed in a desirable fashion—extra electrodes that are not used in the sensor maybe added to help produce the desired stress field. Also, the size and shape of the electrode gripping elements are designed to withstand the elastic force of the elastomer without protruding from the opposite side of the elastomer.

When the elastomer is held in place, the electrodes are heated to melt and plastically deform locally the elastomer around the electrode gripping elements. The heat may be applied by an external heating element to the base or through resistive heating of the electrodes. The heating function (of position, time, and elastomer) is chosen to apply enough heat to melt locally the elastomer, but not to weaken significantly or tear the elastomer. If the main component of the elastomer is an thermoplastic polymer (which may be more sensitive to time-dependent deformations), heat should also be applied to the elastomer in such a way to relieve the some of the stress; this is most important for amorphous thermoplastics (one example is polyvinyl chloride), but needs to be considered for primarily thermoplastic polymers (including, but not limited to polyethylene and polypropylene). The plastic deformation and elastic forces of the elastomer provide a robust mechanical and electrical connection between the elastomer and the electrode.

EXAMPLE 2

Figures 2A, 2B:
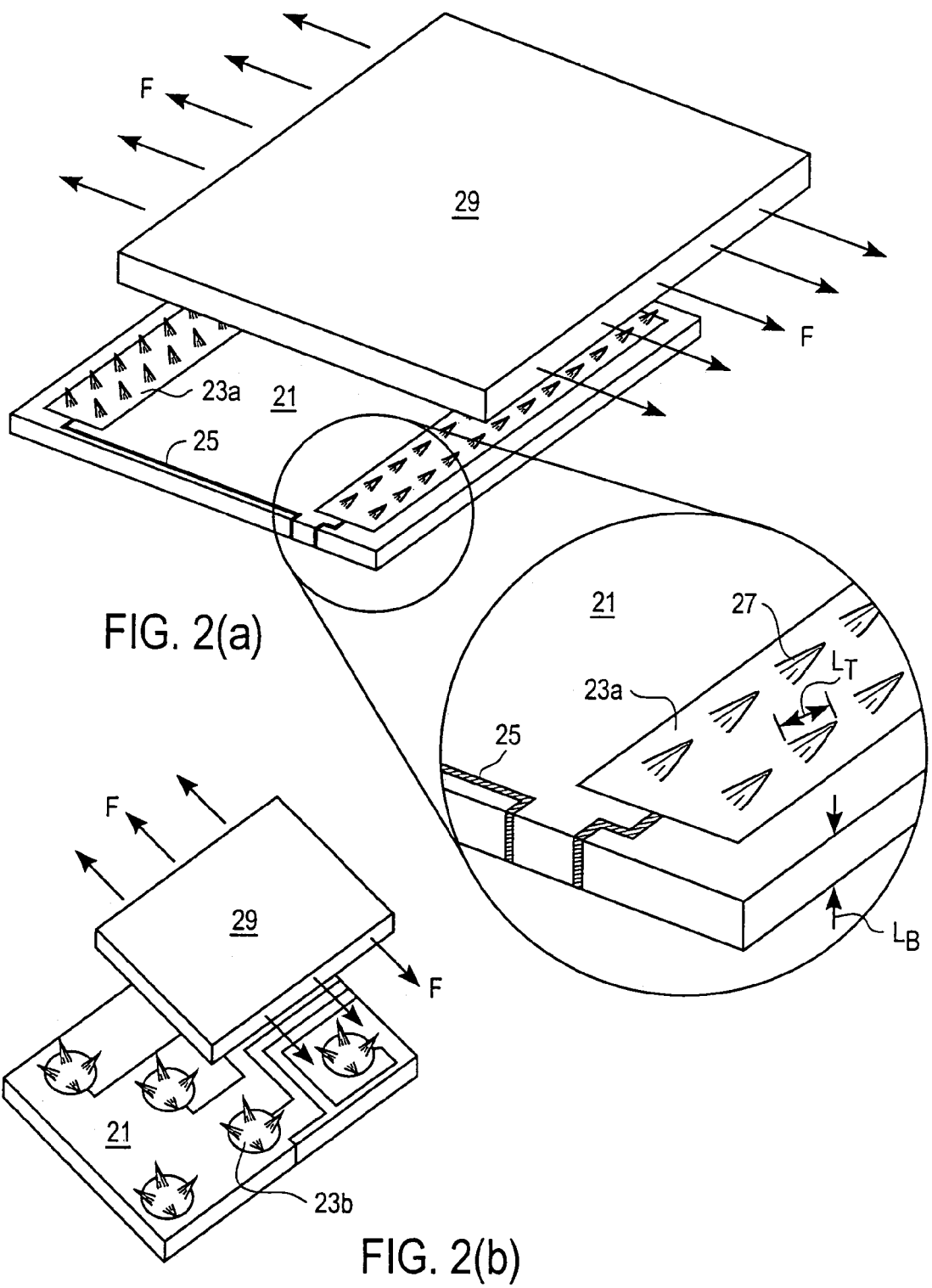
FIGS. 2(a)–2(b) illustrate examples of embodiments of electrodes and foam to be used with the stretch mount and heat sealing method, according to the invention.

Examples of this method include, but are not limited to, electrodes attached on opposite edges of the same elastomer face (such as the parallel electrode arrangement shown in for example patent application Ser. No. 09/654,481). For these sensors, FIGS. 2a–2b show in perspective views some example embodiments of the electrodes 23 and foam 29, whereby the electrodes 23 have different shaped areas (e.g., polygonal shaped area 23a, or elliptically shaped areas 23b). As seen in FIGS. 2(a)–2(b), foam 29 is stretched using force to pull the foam outward.

The electrodes 23 are both rigidly adhered or fastened to a substrate 21, such as a printed circuit board or housing element. Electrodes 23 have rectangular shapes 23a or elliptical shapes 23b (such as seen in FIGS. 2(a)–2(b)), in this example, to which wires 25 connect to the sensor electronics (not shown) of the tactile sensor. In general, the area of electrode 23 can be any geometry such as circular, rectangular, etc. Multiple tooth-like spikes 27 protrude through the electrode body 23 at a particular range of angle θ (see the detailed view shown in FIG. 2(c)). This range of θ is between 10 and 80 degrees, preferably between 45 and 75 degrees in some embodiments. All spikes on a single electrode 23 are substantially parallel and generally face away from the direction of the spikes on the opposing electrode. In this example, the tooth-like spikes 27 can be stamped out of the body 23, but in general they can also be inserted through and rigidly attached to the body 21 by soldering, welding, or other methods. As shown in the detailed view of FIG. 2(a), the substrate thickness $L_B$ and spike length $L_T$ are chosen such that the height (tooth length* sin angle θ) of the spike is less than the thickness of the elastomer 29.

Figure 2C:
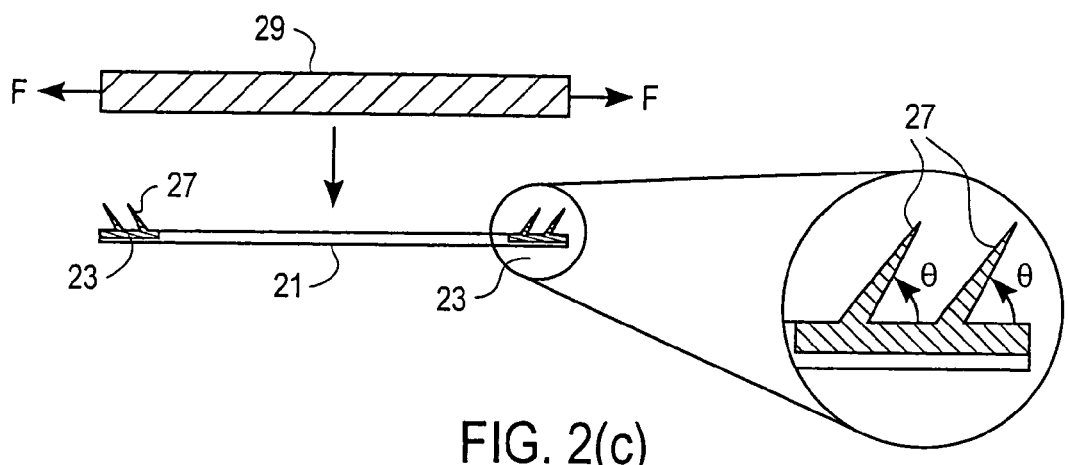
FIG. 2(c) illustrates the stretch mounting and heating sealing initial configuration, according to the specific embodiment.

Forces F stretch the conductive elastomer 29 outward in the general direction of the tooth-like spikes so that the elastomer catches onto the spikes when the stretching forces are released to cause the elastomer to be securely fixed onto the spikes. For example, where the tooth-like spikes are placed on two rectangular areas 23a (see FIG. 2(a)) on opposite ends of the base, the respective tooth-like spikes on each area 23a are pointed in opposite outward directions or generally outwardly. FIG. 2(c) also shows a cross sectional view that demonstrates the elastomer 29 being stretched above substrate 21 with electrodes 23 having spikes 27 thereon. As another example, where the tooth-like spikes are placed on multiple elliptically shaped areas 23b, as shown in FIG. 2(b), the spikes 27 on each area would be pointed in opposing outward directions or generally outwardly. The elastomer stretching is done in the direction of the tooth-like spike to least twice the length of spike projected down on the base, which is 2*tooth length* cos angle θ). The elastomer 29 in this example is a closed cell electrically conductive sheet of polyethylene (melting point 100° C.). As the elastomer in the stretched configuration is moved vertically down, the force F is reduced and the elastomer 29 is impaled onto the teeth of electrodes 23 until the elastomer bottom surface touches the base 21, as seen in FIG. 2(d).

Figure 2D:
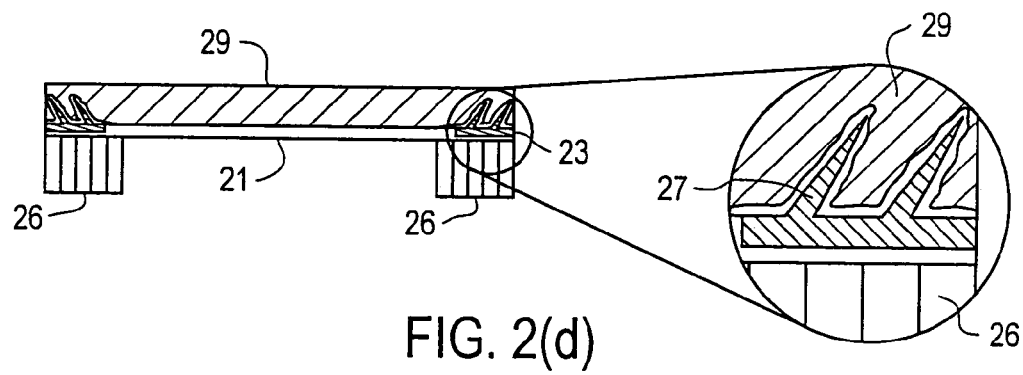
FIG. 2(d) illustrates the elastomer being applied to the electrodes and heating conductive heating elements applied to electrodes, according to the embodiment of FIG. 2.
Figure 2E:
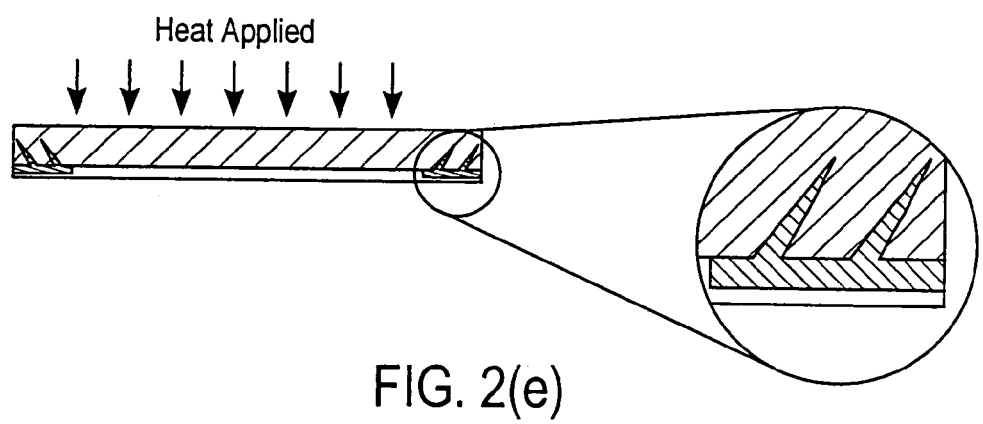
FIG. 2(e) illustrates the effects of electrode heating for heat sealing, according to the embodiment of FIG. 2.

Once the elastomer 29 is held mechanically to the electrodes 23, the electrodes are heated (see FIG. 2(d)) to about 110° C. to about 130° C., preferably about 120° C. in a specific embodiment (where the elastomer is polyethlyene foam having a melting point of about 100° C.). The body of the tooth-like spikes 27 should be slightly above the melting point of the elastomer 29. The heating (e.g., from application of heating elements 26 to electrodes 23) causes the elastomer to melt and plastically deform locally around the teeth 27 (see the detailed views in FIG. 2(d) and FIG. 2(e)), securing the elastomer in place and providing a robust electrical contact.

In still other embodiments, the present invention provides for a method of perforating a conductive material on the electrically conductive elastomer and then heating to create electrodes embedded in the elastomer. In particular, electrodes can be attached to elastomer by punching through a layer of conductor material into the elastomer and heating the base to melt locally the elastomer. Though there is no energy used to stretch the elastomer (as in the stretching method described above), this method may require significant energy expenditure during the punching process. The perforate and melt technique is most useful for sensors that require strips or sheets of electrodes running along an entire sensor edge or surface, but can be used for small electrodes of any shape or size that need to be scattered across the surfaces of the elastomer. The raw materials required for this method are inexpensive, but tooling costs may be higher than the devices used in other embodiments. This method cannot be used easily to fix the elastomer to a rigid surface; however, these types of embodiments can be useful in certain applications as already mentioned.

A punch (or a set of punches (e.g., 31, 35, 36)) is fashioned to pierce holes in a thin (less than 1/8") layer of conductor. The punches are designed to create burrs from the punching process that will hold thin layers of conductor 37 to the elastomer 39. Depending on the stiffness and strength of the elastomer, a concentrating plate 41 may need to be used with the punch that is used; the plate is fashioned with protuberances opposite the punch locations to help concentrate accurately the load from the punch. As seen in FIG. 3, a wheel with punching elements can be provided to pierce particularly shaped holes (e.g., punch wheel 35 has tooth-like puncture elements, punch wheel 31 has cylindrical or block type puncture elements, and punch 36 has a variety of shaped puncture elements).

Thin pieces, strips, or sheets of conductors (any shape or size) 37 are placed on an elastomer surface in the position of attachment. The conductors may also be placed on opposing sides of the elastomer. These conductors are the main bodies (bases) of the electrodes. A single punch (or a set of punches) is stamped quickly through the conductive layer creating burrs on the electrodes that will serve to grip the elastomer. In cases where the conductive electrodes are on opposite surfaces of the elastomer and the elastomer is sufficiently thin (and no concentrating plate is needed), the punches may be designed to create burrs that lock together. The design of the punches is chosen such that hole size, hole spacing, burr shape, and burr size create a perforation that holds well to the elastomer.

When the elastomer is held in place, the electrodes are heated to melt and plastically deform locally the elastomer around the burrs and to the base. Alternatively, the elastomer may be heated to melt the elastomer locally around the burrs of the electrodes. The heat may be applied by an external heating element to the base or through resistive heating of the electrodes. The heating function (of position, time, and elastomer) is chosen to apply enough heat to melt locally the elastomer, but not to weaken significantly or tear the elastomer. The plastic deformation of the elastomer provides a robust mechanical and electrical connection between the elastomer and the electrode.

In cases where the electrodes need to run along a straight line on an elastomer surface or along an entire surface, thin strips or sheets of conductor are rolled off a spool onto the elastomer. As the conductor is placed onto the elastomer, a wheel or roller with spikes (of appropriate shape and size) punches holes into the conductor. This roller is heated (or a separate heated roller may follow) to melt locally the elastomer around the burrs formed by the punching roller.

EXAMPLE 3

An example of the perforate-and-melt method includes, but is not limited to, the attachment of a strip of conductor to a thin sheet of elastomer; one example of a tactile sensor that requires electrode attachment to an elastomer can be found in U.S. Pat. No. 5,060,527.

FIGS. 3(a)–3(c) illustrate exemplary rollers or wheels with various types of punching elements and which rotate about axis 32. For example, FIG. 3(a) shows a wheel 31 having punching elements 33 that are square-edged but which can create a rectangular or elliptical or any shaped punch in the materials to which the wheel is applied. FIG. 3(b) shows a wheel 35 having punching elements 45 that are tooth-like and can create a burr or tooth-like spike in the material when the wheel is applied. FIG. 3(c) shows a wheel 36 having punching elements which are variously shaped (e.g., square-edged, tooth-like, knife-like or triangularly shaped) on the same wheel.

According to this embodiment, a tactile sensor has an electrode formed of a thin strip of conductive material 37 (examples include, but are not limited to copper, zinc, silver, and gold). In this method, the electrode layer 37 is rolled out over the elastomer sheet 39, such as a foam layer. Following the layer 37, a roller (e.g. wheel 31 as shown in FIG. 3(a)) with punching elements is rolled over the conductive layer. The punching elements pierce the conductive layer 37 and create burrs in the electrodes that dig into the elastomer sheet 39.

The shape, size, and density of the spikes are chosen to pierce smoothly the conductive layer 37, create a burr on the electrodes that will grab the elastomer sufficiently, and exit the hole without damaging the burr. The tooth-like spikes shown above in FIGS. 2 could have been created by this method using a roller with punching elements. FIG. 3(a) shows the punching elements only partially extending through elastomer 39.

Once the electrode has been perforated by the roller and is thus being held mechanically to the elastomer, the electrodes are heated to about 110° C. to about 130° C., preferably about 120° C. in a specific embodiment (where polyethylene foam having a melting point of about 100° C. is used). The heating temperature used should be slightly above the melting point of the elastomer. The heating causes the elastomer to melt and plastically deform locally around the burrs, securing the elastomer in place and providing a robust electrical contact.

However, if the punching elements are desired to go entirely through the thickness of elastomer 39, the punching element can have a matching or mating workpiece to form the extruded metal. For example, FIGS. 4(a)–4(c) illustrate the use of a punching element 51 (not a wheel) with a mating workpiece 41 positioned underneath conductive layer 37 and elastomer 39. FIG. 4(a) shows the unpierced layers 37 and 39 with workpiece 41 thereunder with punching element 51 poised to pierce layers 37 and 39. FIG. 4(b) illustrates the extruded metal of conductive layer 37 that has been shaped by coordinated application of punching element 51 and workpiece 41. As seen in the detailed view in FIG. 4(b), the elastomer layer 39 has a rough, torn edge near the point of piercing. Similar as described above, the electrodes created in the conductive layer are then heated to above the melting point of the elastomer which then melts and deforms plastically around the extruded metal to smooth the rough edges of the elastomer, as seen in FIG. 4(c).

Various specific embodiments of the methods according to the present invention have been discussed above. Generally, conductive foams are now being made out of more inert (chemically and environmentally) materials such as polyethylene and polypropylene; one method is doping the polymer with carbon or other impurities that are conductive. One example of intrinsically electrically conductive foam is Evazote® by Zotefoams, Inc; the polyethylene becomes electrically conductive by adding carbon to the polymer during formation. These materials are much more difficult to bond to, and the present methods discussed in this specification advantageously are well-adapted to bonding to such materials.

Some prior art methods have attached electrodes to open or closed cell materials (foams and such) to sheets of metal, plastics. However, such prior art methods are not believed to maintain an electrical contact that is accurate and precise. If the prior art methods were used in a product the measures contact resistance, the contact resistance (same order of magnitude) between the electrodes and the foam cannot change over time or the measuring devices would not be usable. Tactile sensors that use electrically conductive elastomer rely on impedance changes to determine position or magnitude of applied pressure. These impedance changes are a result of either an internal resistance change in the elastomer, i.e., the electrical resistance of the elastomer along a given direction varies with applied force, or a change in the contact resistance between the elastomer and the measuring device. The internal resistances of some classes of electrically conductive elastomer do not vary significantly with applied pressure. For tactile sensors that use these materials, fluctuations of contact resistances between elastomer and the measuring device need to be measured accurately to provide measures of position and pressure applied.

The present invention provides methods which advantageously provide a constant contact resistance over time between the attached electrodes and the elastomer (e.g., foam).

Although some of the above specific examples may use or mention particular low-temperature solders, other examples also may be used with specific embodiments of the present invention (e.g., other examples of low-temperature solders include the following alloys: 58Bi/42Sn (138° C. m.p.), and 57Bi/42Sn/1Ag (137° C. m.p.) such as available from Melcor, Nippon Joint Co. Ltd., and Lake Shore Cryotronics Inc. among others).

Further other variations and modifications may be made in the spirit of the present invention. Therefore, the scope of the present invention should be limited only by the allowed claims.

What is claimed:

1. A method of manufacturing a tactile sensor including an electrically conductive elastomer, said method comprising the steps of:

providing a base having a plurality of electrodes thereon, each of said plurality of electrodes having at least one spike extending out from said base at a defined angle $\theta$, wherein said at least one spike of one of said plurality of electrodes protrudes from said base in an outward direction away from a direction of said at least one spike of said other of said plurality of electrodes;

stretching said electrically conductive elastomer outward a certain distance;

placing said electrically conductive elastomer onto said base such that said electrically conductive elastomer becomes gripped by said spikes of said plurality of electrodes when said electrically conductive elastomer is no longer stretched;

locally heating said electrically conductive elastomer to slightly higher than a melting point of said electrically conductive elastomer to melt locally said electrically conductive elastomer around said spikes of said plurality of electrodes.

2. The method of claim 1 wherein said angle $\theta$ is between about 10 and 80 degrees.

3. The method of claim 1 wherein said angle $\theta$ is between about 45 and 75 degrees.

4. The method of claim 1 wherein said certain distance comprises at least two times a length of said spike multiplied by $\cos \theta$.

5. The method of claim 1 wherein said certain distance does not exceed an elastic range of said electrically conductive elastomer.

6. The method of claim 1 wherein at least one of said plurality of electrodes is elliptically shaped.

7. The method of claim 1 wherein at least one of said plurality of electrodes is polygonally shaped.

8. The method of claim 1 wherein at least one of said plurality of electrodes is rectangularly shaped.

9. The method of claim 1 wherein said spikes are tooth-like.

10. The method of claim 1 wherein said electrically conductive elastomer comprises a foam.

* * * * *